(12) United States Patent
Hatakeyama

(10) Patent No.: US 9,443,823 B2
(45) Date of Patent: Sep. 13, 2016

(54) SEMICONDUCTOR DEVICE INCLUDING FILLING MATERIAL PROVIDED IN SPACE DEFINED BY THREE SEMICONDUCTOR CHIPS

(71) Applicant: Micron Technology, Inc., Boise, ID (US)

(72) Inventor: Norio Hatakeyama, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/706,258

(22) Filed: May 7, 2015

(65) Prior Publication Data

US 2015/0333038 A1    Nov. 19, 2015

(51) Int. Cl.
| | |
|---|---|
| *H01L 23/00* | (2006.01) |
| *H01L 25/065* | (2006.01) |
| *H01L 23/31* | (2006.01) |
| *H01L 21/56* | (2006.01) |

(52) U.S. Cl.
CPC ............ *H01L 24/97* (2013.01); *H01L 21/561* (2013.01); *H01L 23/3107* (2013.01); *H01L 23/3128* (2013.01); *H01L 24/49* (2013.01); *H01L 25/065* (2013.01); *H01L 25/0652* (2013.01); *H01L 25/0657* (2013.01); *H01L 2224/05554* (2013.01); *H01L 2224/32225* (2013.01); *H01L 2224/32245* (2013.01); *H01L 2224/48227* (2013.01); *H01L 2224/49175* (2013.01); *H01L 2224/73265* (2013.01); *H01L 2224/97* (2013.01); *H01L 2924/15311* (2013.01); *H01L 2924/181* (2013.01)

(58) Field of Classification Search
CPC ................... H01L 2924/181; H01L 2224/97; H01L 25/0657; H01L 2224/16145; H01L 24/97; H01L 24/49
See application file for complete search history.

(56) References Cited

U.S. PATENT DOCUMENTS

| | | | | |
|---|---|---|---|---|
| 6,437,990 B1 * | 8/2002 | Degani | ............ | H01L 23/49816 257/723 |
| 6,582,991 B1 * | 6/2003 | Maeda | .................... | H01L 24/81 257/778 |
| 6,610,560 B2 * | 8/2003 | Pu | ......................... | H01L 21/563 257/720 |
| 6,960,827 B2 * | 11/2005 | Nishimura | .............. | H01L 25/03 257/686 |
| 7,294,927 B2 * | 11/2007 | Takahashi | ............. | B81C 1/0023 257/724 |

(Continued)

FOREIGN PATENT DOCUMENTS

| | | |
|---|---|---|
| JP | 2000315776 A | 11/2000 |
| JP | 2003015776 A | 1/2003 |
| JP | 2012230981 A | 11/2012 |

*Primary Examiner* — Ngan Ngo
(74) *Attorney, Agent, or Firm* — Perkins Coie LLP

(57) ABSTRACT

A semiconductor device comprises a wiring substrate, first and second semiconductor chips mounted on the wiring substrate so as to be spaced apart from each other, a third semiconductor chip mounted on the first and second semiconductor chips, first and second adhesive layers that are provided between the first and second semiconductor chips and the wiring substrate so as to bond the first and second semiconductor chips to the wiring substrate, and a third adhesive layer that is provided between the third semiconductor chip and the first and second semiconductor chips so as to bond the third semiconductor chip to the first and second semiconductor chips, with its thickness being made thicker than that of the first and second adhesive layers, a sealing layer covering the wiring substrate, and a filling layer that is provided between the first and second semiconductor chips and is different from the sealing layer.

19 Claims, 11 Drawing Sheets

(56) References Cited

U.S. PATENT DOCUMENTS

| | | | |
|---|---|---|---|
| 8,304,881 B1* | 11/2012 | Haba | H01L 23/3128 257/686 |
| 8,338,963 B2* | 12/2012 | Haba | H01L 23/3128 257/777 |
| 8,618,654 B2* | 12/2013 | Sutardja | H01L 23/481 257/723 |
| 8,759,982 B2* | 6/2014 | Crisp | H01L 25/0655 257/723 |
| 8,787,032 B2* | 7/2014 | Haba | H01L 23/13 361/803 |
| 8,896,126 B2* | 11/2014 | Setardja | H01L 23/13 257/685 |
| 8,907,500 B2* | 12/2014 | Haba | H01L 25/07 257/685 |
| 8,928,153 B2* | 1/2015 | Haba | H01L 25/16 257/777 |
| 8,941,999 B2* | 1/2015 | Haba | H01L 23/13 361/735 |
| 8,952,516 B2* | 2/2015 | Zohni | H01L 23/13 257/668 |
| 9,013,033 B2* | 4/2015 | Haba | H01L 23/492 257/698 |
| 2002/0043719 A1 | 4/2002 | Iwaya et al. | |
| 2003/0011986 A1 | 1/2003 | Ariga | |
| 2008/0224306 A1* | 9/2008 | Yang | H01L 24/24 257/725 |
| 2010/0207267 A1* | 8/2010 | Lin | H01L 23/13 257/692 |
| 2010/0224992 A1* | 9/2010 | McConnelee | H01L 23/5383 257/723 |
| 2011/0089553 A1* | 4/2011 | Kim | H01L 23/13 257/686 |
| 2011/0147917 A1* | 6/2011 | England | H01L 23/49827 257/692 |
| 2011/0163391 A1* | 7/2011 | Kinzer | H01L 21/76898 257/401 |
| 2011/0227212 A1* | 9/2011 | Cheng | H01L 25/0652 257/724 |
| 2012/0273971 A1 | 11/2012 | Usami | |
| 2014/0027906 A1* | 1/2014 | Narita | H01L 23/00 257/738 |
| 2014/0036166 A1* | 2/2014 | Kurasawa | G02F 1/13338 349/12 |
| 2014/0167243 A1* | 6/2014 | Shen | H01L 23/10 257/692 |
| 2015/0243631 A1* | 8/2015 | Haba | H01L 25/0652 257/724 |

* cited by examiner

SEMICONDUCTOR DEVICE INCLUDING FILLING MATERIAL PROVIDED IN SPACE DEFINED BY THREE SEMICONDUCTOR CHIPS

CROSS-REFERENCE TO RELATED APPLICATION

This application is based upon and claims the benefit of priority from Japanese Patent Application No. 2014-098841, filed on May 12, 2014, the disclosure of which is incorporated herein in its entirety by reference.

BACKGROUND OF THE INVENTION

1. Field of the Invention

The patent invention relates to a semiconductor device, and more particularly to such a device having a filling material provided in a space which is defined by three semiconductor chips. The present invention may also relate to a method of manufacturing such a device.

2. Background

Japanese Patent Application Laid-Open No. 2000-315776 has disclosed a semiconductor device of an MCP (Multi Chip Package) type in which a plurality of semiconductor chips is planarly assembled on a wiring substrate so as to be configured into a package.

Due to the thickness reduction of a wiring substrate and a semiconductor chip, influences caused by warpage on the semiconductor device become greater. Since a clearance of about 0.2 mm needs to be prepared between the plural semiconductor chips so as to dispose a connection pad or the like, a problem arises in which warpage or twisting having a shape of two bunchy projections is generated on a border between semiconductor chips.

Moreover, in the case when, for example, three semiconductor chips are mounted on a wiring substrate, one semiconductor chip and two stacked semiconductor chips are installed in parallel with one another so as to achieve the small size and thinness of the semiconductor device in some cases. In this case, since the thickness of a sealing resin on the one semiconductor chip and the thickness of a sealing resin on the stacked semiconductor chips are greatly different from each other, warpage or twisting of the semiconductor device becomes larger. Moreover, the warpage develops unevenly, with the result that it becomes difficult to adjust the warpage.

Japanese Patent Application Laid-Open No. 2008-192853 and Japanese Patent Application Laid-Open No. 2012-230981 have disclosed semiconductor devices in which on two semiconductor chips arranged side by side on a wiring substrate, a hard member or a silicon substrate is stacked so as to suppress the warpage. Japanese Patent Application Laid-Open No. 2008-192853 has also disclosed a configuration in which a semiconductor chip is used as the hard member.

The following analyses have been made by the inventors of the present application.

Although Japanese Patent Application Laid-Open No. 2000-315776 and Japanese Patent Application Laid-Open No. 2012-230981 have disclosed semiconductor devices in which a plurality of semiconductor chips are planarly disposed, no semiconductor chip in which a plurality of semiconductor chips are stacked has been disclosed.

Japanese Patent Application Laid-Open No. 2012-230981 has disclosed a stacked semiconductor device in which warpage is suppressed. However, Japanese Patent Application Laid-Open No. 2012-230981 has failed to take into consideration deformation or the like of a plurality of wires for use in electrically connecting a semiconductor chip on a lower stage and a wiring substrate with each other, especially the deformation or the like of the plural wires located below the semiconductor chip on the upper stage, and also has failed to take into consideration voids occurring on the periphery of the plural wires. The same is basically true for Japanese Patent Application Laid-Open No. 2000-315776.

BRIEF DESCRIPTION OF THE DRAWINGS

FIG. 1A is a plan view, and FIG. 1B is a cross-sectional view taken along line B-B of FIG. 1A;

FIG. 4A is a plan view, and FIG. 4B is a cross-sectional view taken along line B-B of FIG. 4A;

DETAILED DESCRIPTION OF THE EMBODIMENTS

This invention will be described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1A:
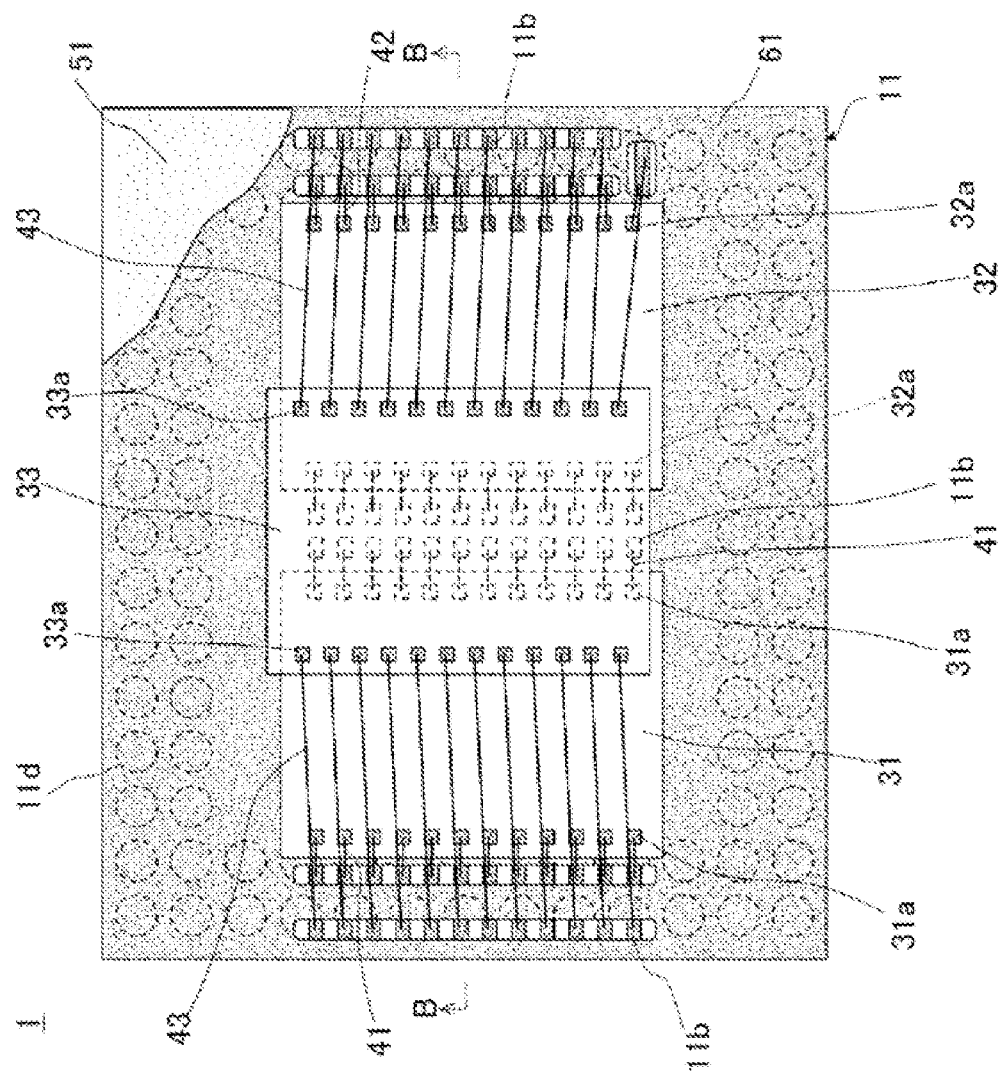
FIGS. 1A and 1B are views that schematically show the outline configuration of a semiconductor device in accordance with embodiment 1.
Figure 1B:
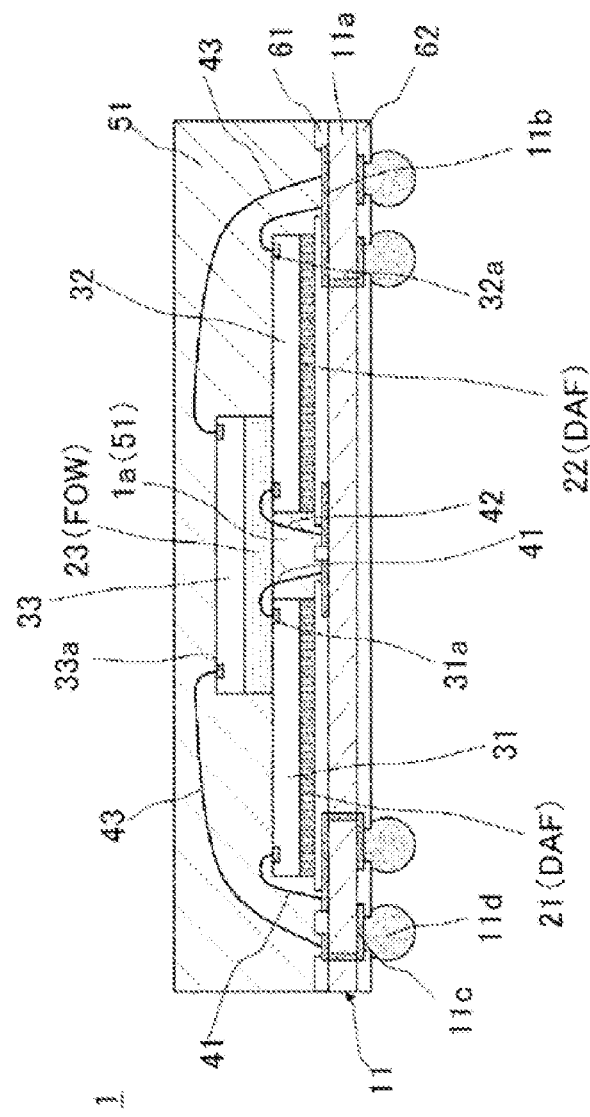

As shown in FIGS. 1A and 1B, a semiconductor device 1 in accordance with embodiment 1 has the following configuration including:

a wiring substrate 11;

first and second semiconductor chips (pair of lower chips) 31 and 32 mounted on one surface of the wiring substrate 11;

a third semiconductor chip (upper chip) 33 mounted so as to straddle the first and second semiconductor chips 31 and 32;

first and second adhesive layers 21 and 22 formed between the first and second semiconductor chips 31, 32 and one surface of the wiring substrate 11 so as to bond the first and second semiconductor chips 31, 32 to the one surface of the wiring substrate 11; and a third adhesive layer 23 which is formed between the third semiconductor chip 33 and the first and second semiconductor chips 31, 32 so as to bond the third semiconductor chip 33 to the first and second semiconductor chips 31, 32, and is preferably formed so as to be made thicker than the first and second adhesive layers 21 and 22.

The wiring substrate 11 and the first to third semiconductor chips 31 to 33 are electrically connected to one after another through first to third wires 41 to 43. The third adhesive layer 23 is formed so as to embed at least one portion of the wires 41 and 42 located below the third semiconductor chip 33 of the first and second wires 41 and 42.

The semiconductor device 1 is provided with a sealing material 51, such as a sealing resin, a thermosetting resin (e.g., and epoxy resin), or the like, formed on one surface of the wiring substrate 11 so as to cover the first to third semiconductor chips 31 to 33. The sealing material 51 is also supplied to a space surrounded by the first to third semiconductor chips 31 to 33 and one of the surfaces of the wiring substrate 11, more specifically, a space between the first and second semiconductor chips 31 and 32 in the plane direction, that is, a space between the third semiconductor chip 33 and one surface of the wiring substrate 11 in the stacked direction so that a filling layer 1a that fills in the corresponding space is formed. In other words, the filling layer 1a is formed by the sealing material 51 at the time of its formation.

The following description will explain constituent element of the semiconductor device 1 in detail.

In the wiring substrate 11, predetermined wiring patterns are formed on the two surfaces of the insulating base member 11a made of a glass epoxy substrate or the like. The wiring substrate 11 has a substantially rectangular shape, for example, with a thickness of about 90 μm.

A first insulating film 61 is formed on one surface of the wiring substrate 11, with a second insulating film 62 being formed on the other surface of the wiring substrate 11. The first and second insulating films 61 and 62 are made of, for example, solder resist layers. The wiring patterns on the two surfaces of the wiring substrate 11 are covered with the first and second insulating films 61 and 62 except for one portion thereof. The insulating base member 11a serving as the base member of the wiring substrate 11 is made of, for example, a plate-shaped member formed by allowing a cloth made of glass fibers to be impregnated with an epoxy resin.

On one of the surfaces of the wiring substrate 11, a plurality of connection pads 11b, which can be exposed through a plurality of openings formed on the first insulating film 61, are formed. On the other surface of the wiring substrate 11, a plurality of lands 11c, which can be exposed through a plurality of openings formed on the second insulating film 62, are formed. The plural lands 11c are disposed in two rows along each of four sides on the other surface of the wiring substrate 11. The plural connection pads 11b and the plural lands 11c are electrically connected with each other through conductive portions inside the insulating substrate 11a. On the plural lands 11c, a plurality of solder balls 11d are mounted so that a plurality of external electrodes 11d are formed. To the plural external electrodes 11d, another wiring substrate or package can be connected.

The first to third semiconductor chips 31 to 33, each of which has a substantially rectangular plate shape, have the same external shape and functions. On one of the surface (upper surface in the Fig.) sides of each of the first to third semiconductor chips 31 to 33, predetermined circuits, for example, such as a memory circuit and a plurality of first to third electrode pads 31a internally connected to the memory circuit, are formed. A plurality of first to third electrode pads 31a to 33a are disposed along the short sides of the wiring substrate 11. Additionally, as the first to third semiconductor chips 31 to 33, for example, memory chips may be used; however, another kind of semiconductor chip may be used, and semiconductor chips having different external shapes and functions may be used in a mixed manner.

The wiring substrate 11 has a surface and a rear surface having a substantially rectangular shape. The first to third semiconductor chips 31 to 33 are mounted on the wiring substrate 11 so as to allow the long sides of each of the first to third semiconductor chips 31 to 33 to be in parallel with the short side of the wiring substrate 11. The first and second semiconductor chips 31 and 32 are disposed on different positions on one surface of the wiring substrate 11. In particular, the first and second semiconductor chips 31 and 32 are disposed plane-symmetrically on the one surface of the wiring substrate 11. Therefore, the short sides of the first and second semiconductor chips 31 and 32 are positioned substantially on one straight line with each other. The third semiconductor chip 33 is positioned in the center region on the one surface of the wiring substrate 11. By using such a highly symmetrical configuration, the warpage of the semiconductor device 1 is reduced.

Additionally, in FIG. 1A, the short sides of the third semiconductor chip 33 are illustrated at positions shifted from the short sides of the first and second semiconductor chips 31 and 32 so as to clearly indicate the laminated relationship of the first to third semiconductor chips 31 to 33. However, the third semiconductor chip 33 is also mounted such that each of the short sides of the third semiconductor chip 33 is positioned substantially along one straight line of each of the short sides of the first and second semiconductor chips 31 and 32.

The first to third wires 41 to 43 electrically connect the plural first to third electrode pads 31a to 33a possessed by the first to third semiconductor chips 31 to 33 with the corresponding plural connection pads 11b on one of the surfaces of the wiring substrate 11. Of the plural first and second wires 41 and 42, the wires 41 and 42 below the third semiconductor chip 33 are embedded into a third adhesive layer 23, with one portion thereof being made thicker, while the rest of the portion is embedded into the filling layer 1a, that is, into one portion of the sealing material 51.

The first and second adhesive layers 21 and 22 are preferably formed by using a DAF (Die Attached Film; resin adhesive material) film, and the third adhesive layer 23 is preferably formed by using a FOW (Film on Wire; resin adhesive material having a viscosity lower than that of DAF with a good wire embedding property) film. The third adhesive layer 33 is formed so as to be thicker than the first and second adhesive layers 21 and 22 so that the wire embedding property or the like can be improved. As the DAF film and FOW film, a tape containing a thermosetting resin or a resin adhesive component containing a thermoplastic resin or the like, or a tape having a resin adhesive material supported thereon with a sticker agent being interposed therebetween may be used. The component of the FOW is adjusted so as to have a viscosity lower than that of the DAF.

The following description will explain effects of the semiconductor device 1 in accordance with embodiment 1.

(1) By disposing the third semiconductor chip (upper semiconductor chip) 33 so as to straddle the first and second semiconductor chips (paired lower semiconductor chips) 31 and 32, it is possible to form the sealing material 51 having a highly symmetrical property. Thus, the warpage of the semiconductor device 1, in particular, the unbalanced warpage thereof, is reduced or the warpage thereof is stabilized.

For example, by making the thickness of the sealing material 51 on the first and second semiconductor chips 31 and 32 uniform, the warpage can be easily controlled.

(2) The configuration in which the third semiconductor chip 33 is disposed so as to straddle the first and second semiconductor chips 31 and 32 is desirably applied to a stacked semiconductor device 1 using an odd number of semiconductor chips of three or more so that the small size and thinness of the semiconductor device 1 are achieved.

(3) By forming the third adhesive layer 23 by the use of FOW, more desirably, by forming the third adhesive layer 23 thicker, the third semiconductor chip 33 can be disposed in the center region of the wiring substrate 11 irrespective of the layouts of the first and second wires 41 and 42. Thus, since the configuration of the semiconductor device 1 can be symmetrically designed, the warpage can be reduced.

(4) By forming the third adhesive layer 23 by the use of FOW that has a high flowability at low viscosity and a good wire embedding property and can prevent voids from occurring on the periphery of wires, the deformation or wire flowing of the plural first and second wires 41 and 42 below the third semiconductor chip 33 can be suppressed and the occurrence of voids on the periphery of the wires 41 and 42 can also be suppressed at the time of assembling the third semiconductor chip 33.

(5) By making the thickness of the third adhesive layer 23 thicker, the above-mentioned effects can be further enhanced, and the spacer (insulating) property is improved.

(6) By filling a space between the first to third semiconductor chips 31 to 33 and one surface of the wiring substrate 11 with the sealing material 51 (by the formation of the filling layer 1a), the plural first and second wires 41 and 42 below the third semiconductor chip 33 can be stabilized so that the occurrence of voids on the periphery of the corresponding wires 41 and 42 can be suppressed. As a result, the reliability of the semiconductor device 1 can be improved.

Next, successively referring to FIGS. 2A to 2F, the following description will explain one example of the manufacturing method of the semiconductor device 1 shown in FIGS. 1A and 1B. Depending on cases, the respective processes may be executed by exchanging the order thereof, or may be simultaneously executed.

Figure 2A:
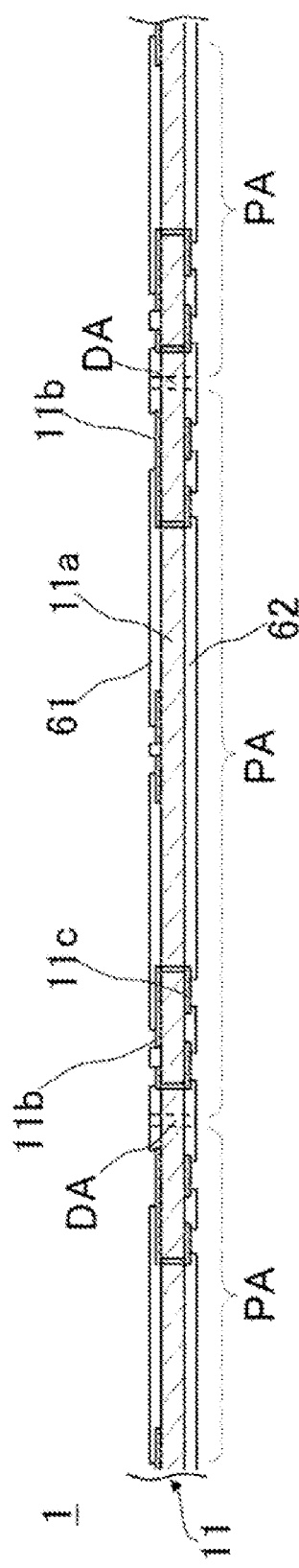
FIGS. 2A to 2F are process charts for use in explaining a manufacturing method of the semiconductor device shown in FIG. 1.

The wiring substrate 11 as shown in FIG. 2A and the first to third semiconductor chips 31 to 33 as shown in FIGS. 1A and 1B are prepared.

A plurality of product regions PA are disposed on the wiring substrate 11. Each of the plural product areas PA is divided by dicing areas DA. After a cutting process along the dicing areas DA, the plural product areas PA are formed into a plurality of wiring substrates 11 forming a plurality of semiconductor devices 1. On the two surfaces of the wiring substrate 11, predetermined wiring patterns including a plurality of connection pads 11b and a plurality of lands 11c are respectively formed. On one of the surfaces of the wiring substrate 11, the first insulating film 61 is formed by using a solder resist, and on the other surface also, the second insulating film 62 is formed by using the solder resist. From a plurality of openings possessed by the first and second insulating films 61 and 62, a plurality of connection pads 11b and a plurality of connection pads 11c are exposed.

With respect to the third semiconductor chip 33, preparations are made in the following manner:

An FOW film for use in forming the third adhesive layer 23 is adhered to the rear surface of a predetermined semiconductor wafer. Preferably, a thick FOW film is adhered thereto so as to form a thick third adhesive layer 23.

The predetermined semiconductor wafer is diced together with the FOW film.

Thus, the third semiconductor chips 33 to which the plural FOW films have been respectively adhered are obtained.

Figure 2B:
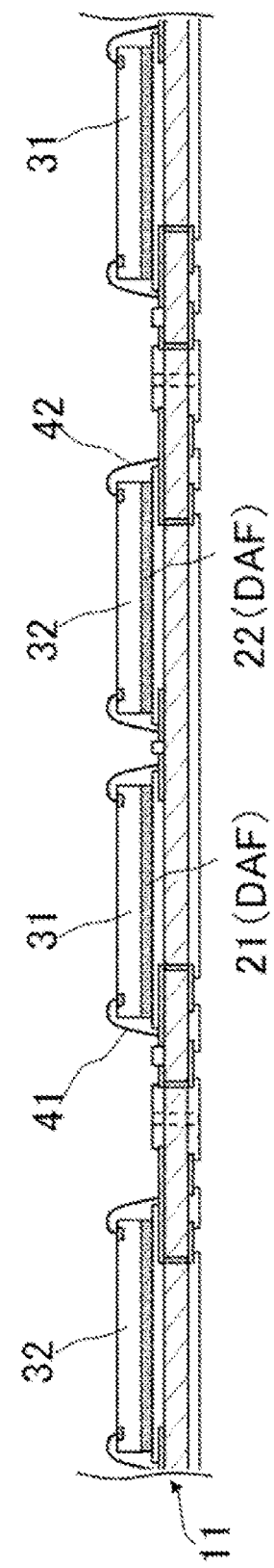

Referring to FIG. 2B, with respect to a pair of semiconductor chips on a lower stage, that is, with respect to die bonding processes of the first and second semiconductor chips 31 and 32, the wiring substrate 11 is set onto a stage (not shown) of a die bonding apparatus. A collet (not shown) of the die bonding apparatus sucks and holds the first and second semiconductor chips 31 and 32. Onto the rear surfaces of the first and second semiconductor chips 31 and 32, DAF films that carry and support adhesive materials to be formed into first and second adhesive layers 21 and 22 are respectively adhered.

On one of the surfaces of the wiring substrate 11, in particular, on a pair of chip mounting areas (different areas) on the first insulating film 61, the first and second semiconductor chips 31 and 32 are assembled or disposed side by side (plane-assembled), with the first and second adhesive layers (DAF) 21 and 22 being interposed therebetween.

The plural first and second electrode pads 31a and 32a possessed by the first and second semiconductor chips 31 and 32 and the plural connection pads 11b possessed by the wiring substrate 11 are electrically connected with each other through the first and second wires 41 and 42.

Figure 2C:
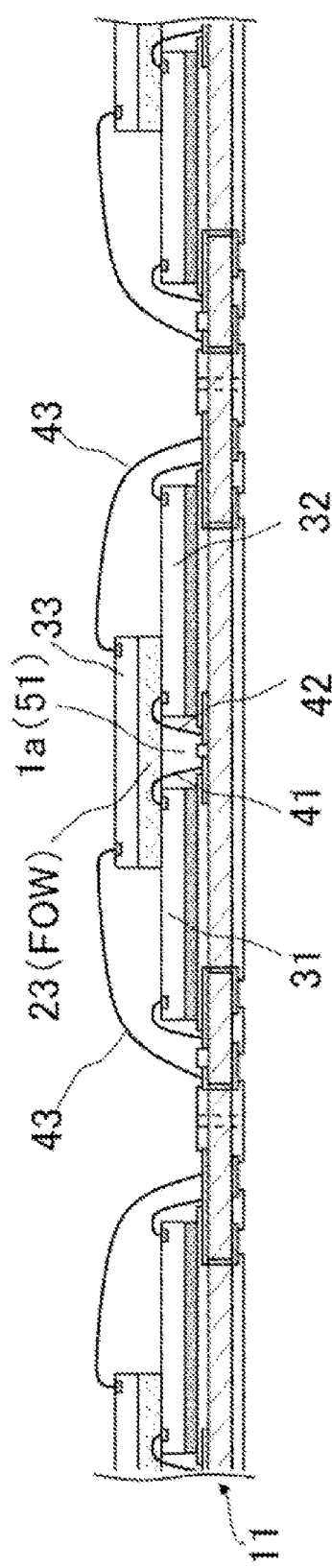

Referring to FIG. 2C, with respect to the semiconductor chip on the upper stage, that is, with respect to the die bonding process of the third semiconductor chip 33, by using the above-mentioned collet, the third semiconductor chip 33 is sucked and held thereon. The collet is lowered.

Onto the rear surface of the third semiconductor chip 33, an FOW film to be formed into the third adhesive layer 23 is adhered. Upon die bonding the third semiconductor chip 33, the FOW is heated by the contact with the heated first and second wires 41 and 42 to be set to a low viscosity state. Into the FOW (third adhesive layer 23) in the low viscosity state, the first and second wires 41 and 42 are embedded. Together with this wire embedding process, the third semiconductor chip 33 is mounted or stacked on the first and second semiconductor chips 31 and 32 in a manner so as to straddle the two chips 31 and 32, with the third adhesive layer (FOW) 23 interposed therebetween. The amount of the FOW supply is increased so as to make the third adhesive layer 23 thicker than the first and second adhesive layers 21 and 22.

The plural third electrode pads 33a of the third semiconductor chip 33 and the plural connection pads 11b of the wiring substrate 11 are electrically connected with each other (wire-bonding connected) through a third wire 43.

Additionally, a heater is formed on the above-mentioned stage. The wiring substrate 11 mounted on the stage, the first to third semiconductor chips 31 to 33, the first to third adhesive layers 21 to 23 and the first to third wires 41 to 43 can be heated by the heater. For example, the heater can heat the first to third wires 41 to 43 to a bonding temperature. The curing process of the first to third adhesive layers 21 to 23 may be carried out before a predetermined wire bonding process, or may be carried out after the process, for example, at one time simultaneously with the curing process of the sealing material 51 to be described later.

Figure 2D:
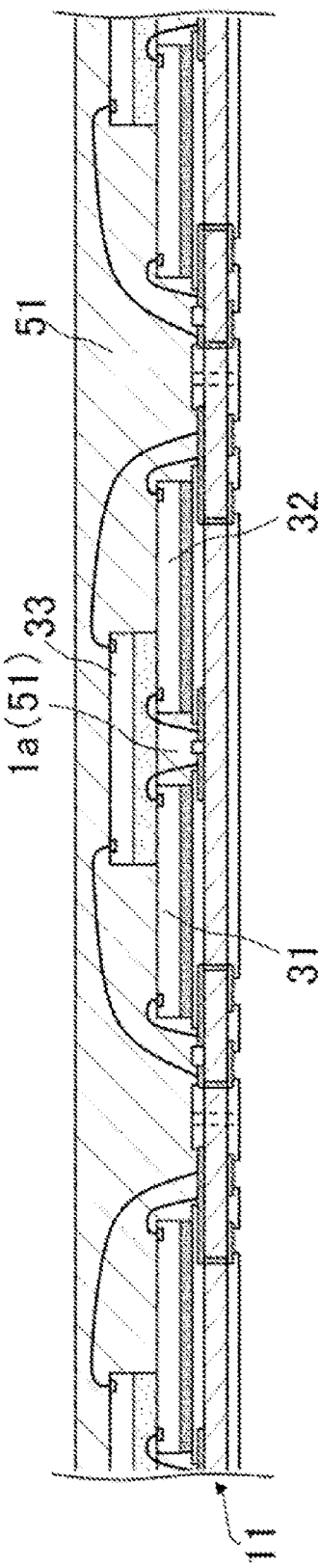

As shown in FIG. 2D, in a molding process, by using a molding die (not shown), the wiring substrate 11 is mold-clumped from above and below. Into the molding die, a heated and melted sealing material 51 is injected. As the sealing material 51, for example, a thermosetting resin, such as an epoxy resin or the like, is used.

The sealing material 51 is also supplied to a space surrounded by the first to third semiconductor chips 31 to 33 and one surface of the wiring substrate 11. By curing the sealing material 51, a filling layer 1a (51) filling the above-mentioned space and the sealing material 51 covering the first to third semiconductor chips 31 to 33 are formed. The filling layer 1a (51) forms one portion of the sealing material 51.

Figure 2E:
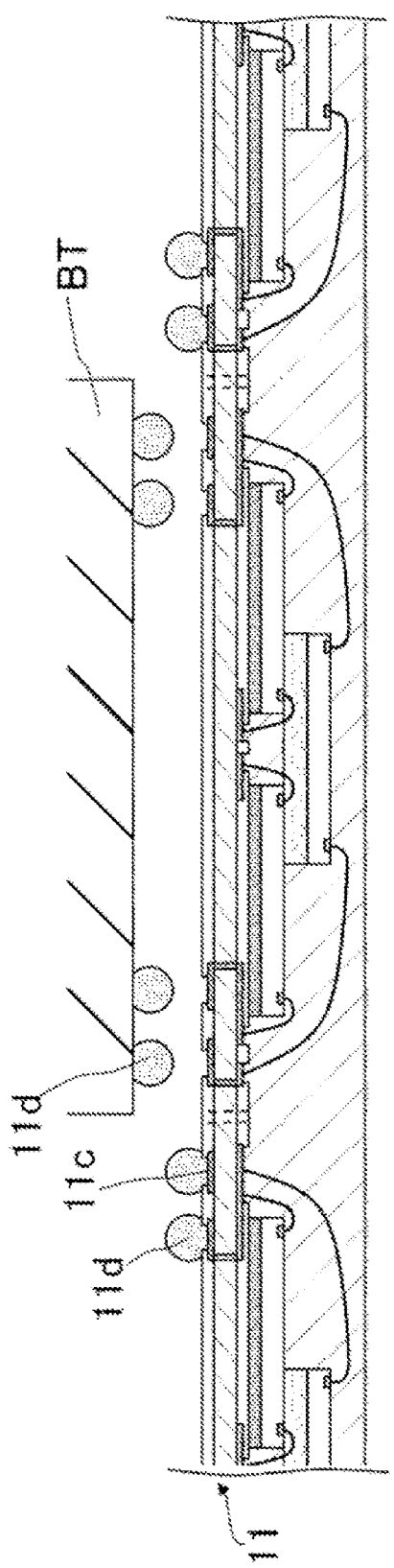

As shown in FIG. 2E, on the other surface side of the wiring substrate 11, a plurality of solder balls 11d are mounted on the plural lands 11c with flux interposed therebetween, by using a ball mount apparatus BT. The plural solder balls 11d are balls made of an electrical conductor, that is, for example, balls made of metal. By carrying out a reflowing process on the wiring substrate 11, the plural solder balls 11d are melted to be connected to the plural lands 11c.

Figure 2F:
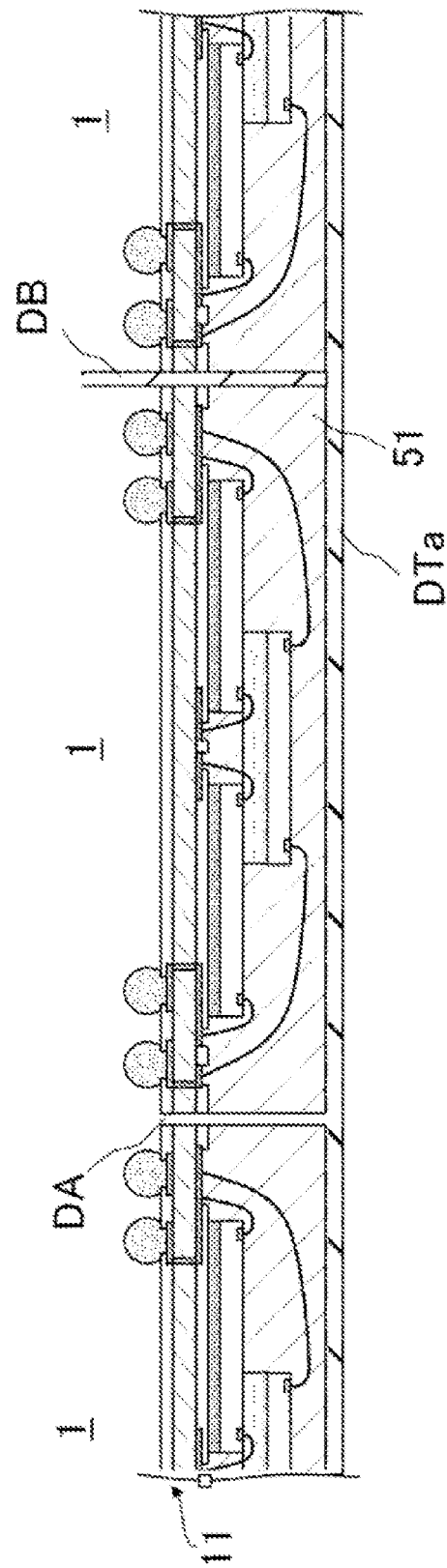

As shown in FIG. 2F, in the substrate dicing process, a dicing tape DTa is adhered onto the sealing material 51 so that the wiring substrate 11 is supported by the dicing tape DTa. By using a dicing blade DB, the wiring substrate 11 is cut longitudinally as well as laterally along the dicing areas DA so that the cutting and separating processes are carried out for each of the product areas PA. Next, by carrying out pick-up processes from the dicing tape DTa, a plurality of semiconductor devices 1 as shown in FIGS. 1A and 1B are obtained.

The following description will explain functions and effects of this manufacturing method.

(1) In order to form the third adhesive layer 23, an FOW film having a good wire-embedding property with a high flowability is used.

(2) The third adhesive layer 23 is made thicker.

(3) A filling layer 1a is formed from the sealing material 51 in a space surrounded by the first to third semiconductor chips 31 to 33 and one of the surfaces of the wiring substrate 11.

(4) The first to third semiconductor chips 31 to 33 are symmetrically disposed.

(5) The sealing material 51 is symmetrically formed.

(6) The deformation of the first and second wires 41 and 42 below the third semiconductor chip 33 can be prevented.

(7) The occurrence of voids on the periphery of the first and second wires 41 and 42 below the third semiconductor chip 33 can be prevented.

(8) By forming the filling layer 1a (51) simultaneously with the sealing material 51 (that is, filling layer 1a forms one portion of the sealing material 51), the energy saving processes can be achieved.

Embodiment 2

In embodiment 2, explanations will be given mainly on differences from embodiment 1, and common points are referred to the description of embodiment 1 on demand.

Referring to FIG. 1B, in the semiconductor device 1 of embodiment 1, the filling layer 1a (51) that fills up the space surrounded by the first to third semiconductor chips 31 to 33 and one of the surfaces of the wiring substrate 11 is formed by the sealing material 51 as one portion of the sealing material 51.

Figure 3:
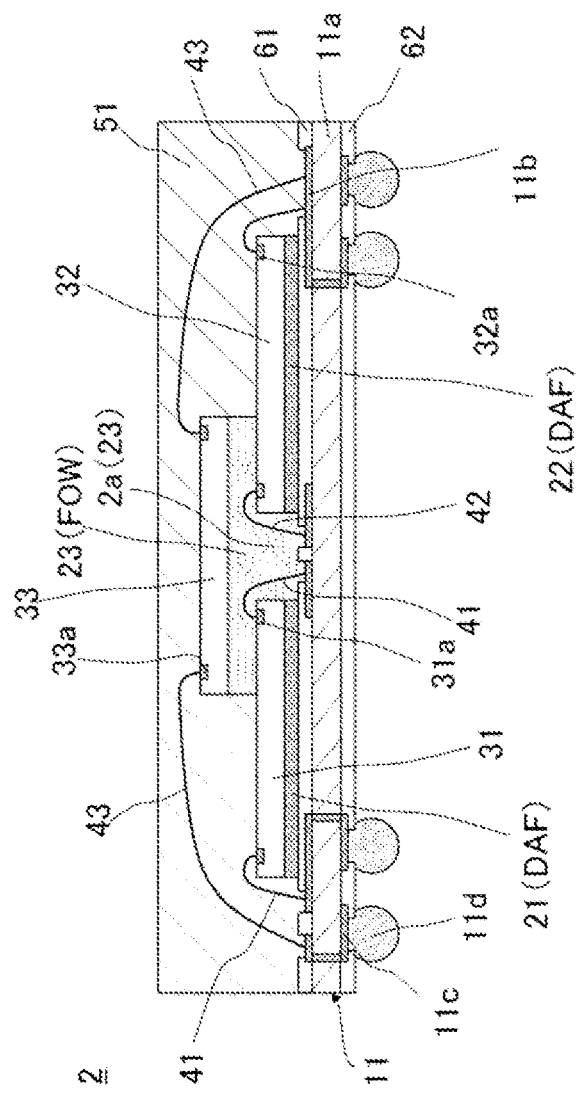
FIG. 3 is a cross-sectional view that schematically shows the outline configuration of a semiconductor device in accordance with embodiment 2.

As shown in FIG. 3, in a semiconductor device 2 in accordance with embodiment 2, a filling layer 2a (23) is formed by using an FOW film for use in forming a third adhesive layer 23.

In accordance with the semiconductor device 2 of embodiment 2, the same effects as those of the semiconductor device 1 of embodiment 1 can be obtained, and the following effects are also obtained.

Before the filling process of the sealing material 51, the above-mentioned narrow space is preliminarily embedded by the FOW for use in forming the third adhesive layer 23, the occurrence of voids, especially, on the periphery of the first and second wires 41 and 42 below the third semiconductor chip 33, is further prevented. In particular, by forming the third adhesive layer (FOW) 23 with a high thickness, the above-mentioned space can be easily embedded by the FOW. Thus, the reliability of the semiconductor device 2 can be further improved.

Embodiment 3

In embodiment 3, explanations will be given mainly on differences from embodiment 1, and common points are referred to the description of embodiment 1 on demand.

Referring to FIG. 1A, in the semiconductor device 1 of embodiment 1, the first to third semiconductor chips 31 to 33 are disposed in parallel with one another when seen in a plan view. The plural first to third electrode pads 31a to 33a possessed by the first to third semiconductor chips 31 to 33 are disposed in parallel with one another. Any one of the plural first to third electrode pads 31a to 33a is disposed in parallel with the short side of the wiring substrate 11.

Figure 4A:
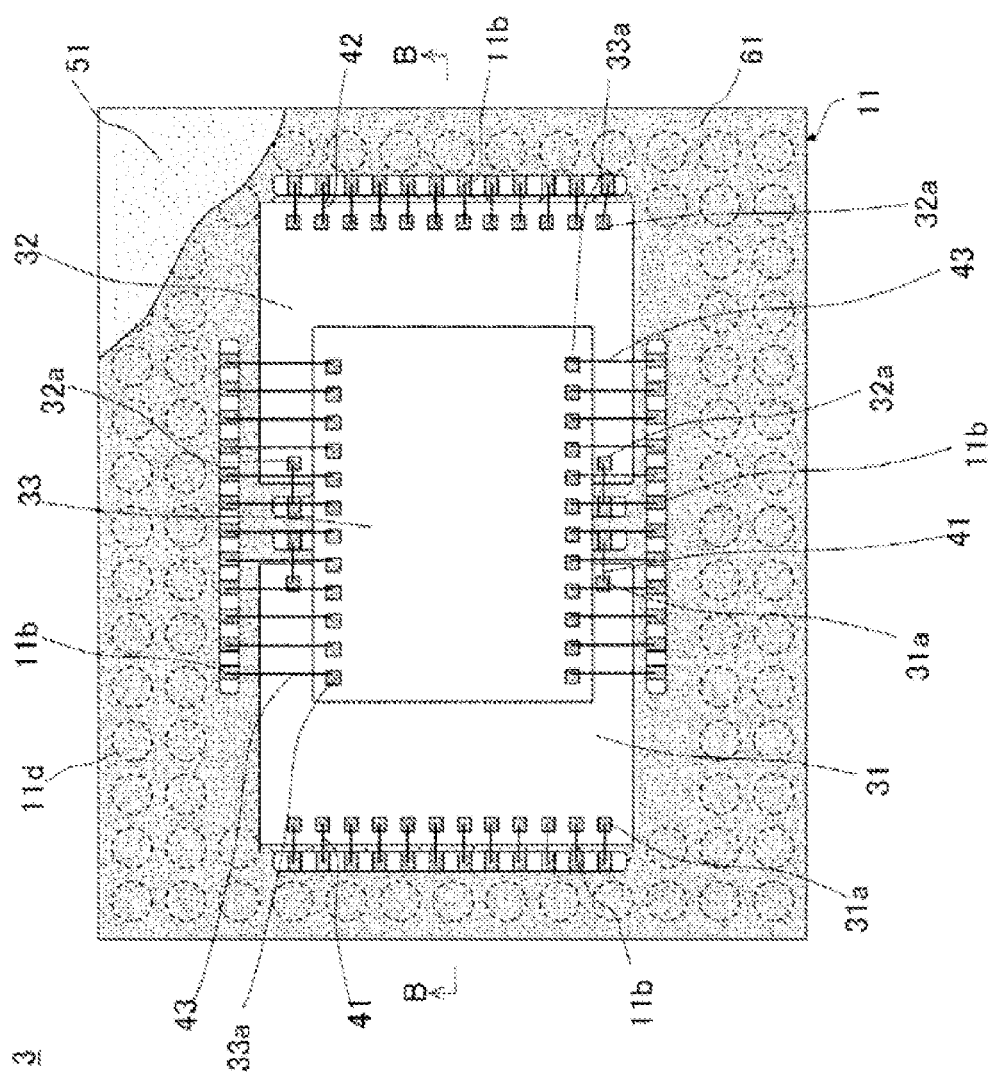
FIGS. 4A and 4B are views that schematically show the outline configuration of a semiconductor device in accordance with embodiment 3.
Figure 4B:
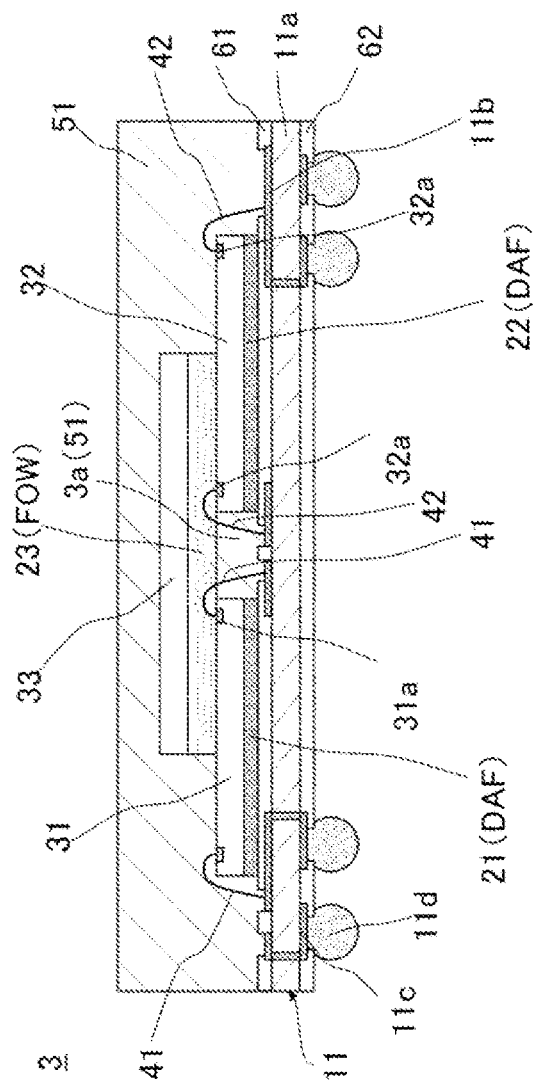

As shown in FIGS. 4A and 4B, in a semiconductor device 3 in accordance with embodiment 3, first and second semiconductor chips 31 and 32 are disposed in parallel with each other when seen in a plan view, while a third semiconductor chip 33 is disposed or stacked in a rotated state with substantially 90 degrees relative to the first and second semiconductor chips 31 and 32. The plural first and second electrode pads 31a and 32a possessed by the first and second semiconductor chips 31 and 32 are arranged in parallel with the paired short sides of the wiring substrate 11, and electrically connected with a plurality of connection pads 11b arranged on the wiring substrate 11 along the paired short sides, through the first and second wires 41 and 42. A plurality of third electrode pads 33a possessed by the third semiconductor chip 33 are arranged on the wiring substrate 11 in parallel with a pair of long sides of the wiring substrate 11, and electrically connected with the plural connection pads 11b arranged along the paired long sides on the wiring substrate 11, through third wires 43.

In the same manner as in the filling layer 1a (51) of embodiment 1, a filling layer 3a (51) is formed by the sealing material 51; however, this may be formed by a third adhesive layer 23 or another resin layer.

In accordance with the semiconductor device 3 of embodiment 3, the effects that are the same as those of the semiconductor device 1 of embodiment 1 are obtained, and the following effects can be further obtained:

A routing process of wires, that is, in particular, the routing process of the third wires 43 that electrically connect the plural electrode pads 33a of the third semiconductor chip 33 with the plural connection pads 11b of the wiring substrate 11 can be easily carried out. The third wires 43 can be made shorter. By arranging the plural connection pads 11b that are electrically connected with the third semiconductor chip 33 along the paired long sides of the wiring substrate 11, a small wiring substrate 11 can be used.

Embodiment 4

In embodiment 4, explanations will be given mainly on differences from embodiment 2, and common points are referred to the description of embodiment 2 on demand.

As shown in FIG. 3, in the semiconductor device 2 of embodiment 2, the filling layer 2a (23), which fills a space surrounded by the first to third semiconductor chips 31 to 33 and one surface of the wiring substrate 11, is formed by an FOW forming the third adhesive layer 23.

Figure 5A:
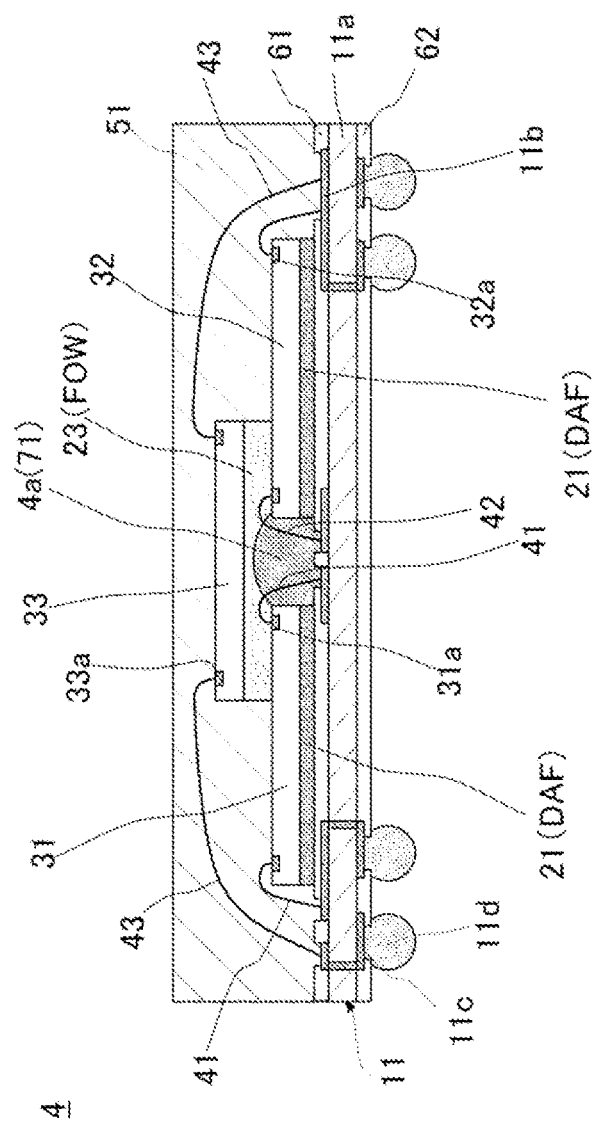
FIG. 5A is a cross-sectional view that schematically shows the outline configuration of a semiconductor device in accordance with embodiment 4.

As shown in FIG. 5A, in a semiconductor device 4 of embodiment 4, a filling layer 4a is formed by another resin layer (resin material having a composition different from that of the sealing layer) 71. Into the filling layer 4a (71), of the first and second wires 41 and 42 that electrically connect the wiring substrate 11 with the first and second semiconductor chips 31 and 32, one portion (one portion on the wiring substrate 11 side) of the wires 41 and 42 located below the third semiconductor chip is embedded. Another portion (another portion on the third semiconductor chip 33 side) of the wires 41 and 42 is embedded into the third adhesive layer 23. The filling layer 4a (71) is formed by supplying a resin adhesive material, for example, a resin material or an under-filling material, to the center area of the wiring substrate 11 or a first insulating film 61 by using a method such as a potting method. The filling layer 4a (71) is formed between the third adhesive layer 23 and one surface (first insulating film 61) of the wiring substrate 11.

In accordance with the semiconductor device 4 of embodiment 4, the same effects as those of the semiconductor device 2 of embodiment 2 can be obtained, and the following effects are also obtained.

Before the filling process of the sealing material 51, the above-mentioned narrow space is preliminarily embedded by another resin layer 71, the occurrence of voids, especially, on the periphery of the first and second wires 41 and 42 below the third semiconductor chip 33, is further prevented. Thus, the reliability of the semiconductor device 4 can be further improved.

Embodiment 5

In embodiment 5, explanations will be given mainly on differences from embodiment 4, and common points are referred to the description of embodiment 4 on demand.

As shown in FIG. 5A, in the semiconductor device 4 of embodiment 4, the filling layer 4a (71) covers one portion of the wires 41 and 42 below the third semiconductor chip of the first and second wires 41 and 42 that electrically connect the wiring substrate 11 and the first and second semiconductor chips 31 and 32.

Figure 5B:
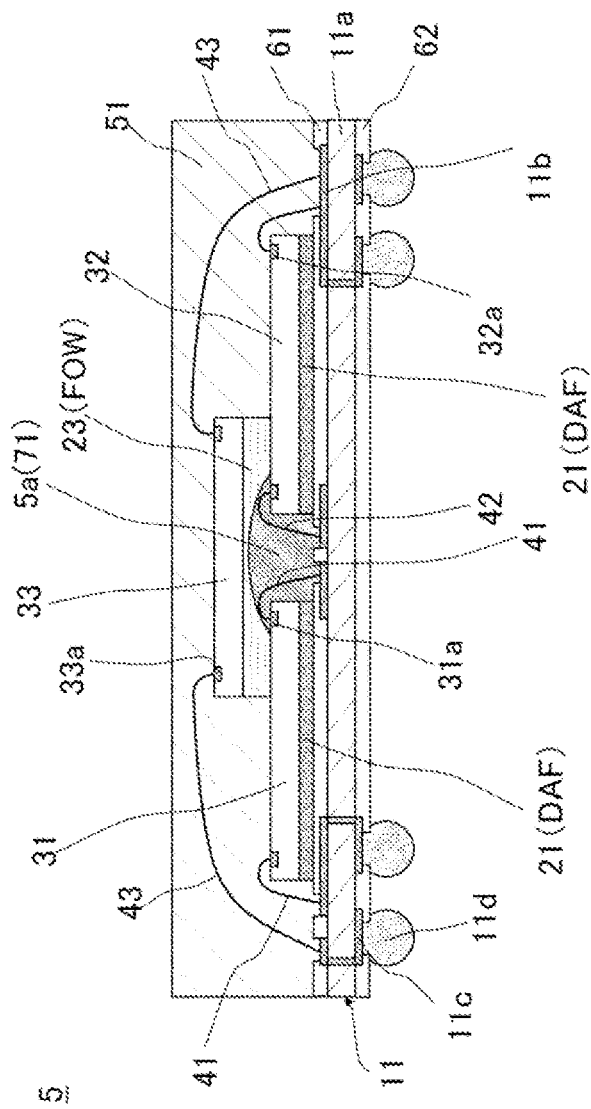
FIG. 5B is a cross-sectional view that schematically shows the outline configuration of a semiconductor device in accordance with embodiment 5.

As shown in FIG. 5B, in a semiconductor device 5 of embodiment 5, a filling layer 5a (71) formed by another resin layer (another resin material) 71 covers the entire portion of the wires 41 and 42 located below the third semiconductor chip 33 of the first and second wires 41 and 42 that electrically connect the wiring substrate 11 with the first and second semiconductor chips 31 and 32.

In accordance with the semiconductor device 5 of embodiment 5, the same effects as those of the semiconductor device 4 of embodiment 4 can be obtained, and the following effects are also obtained.

By the filling layer 5a (71), it becomes possible to prevent the plural first and second wires 41 and 42 located below the third semiconductor chip 33 from contacting the rear surface of the third semiconductor chip 33. By the filling layer 5a (71), upon stacking the third semiconductor chip 33, it becomes possible to prevent the plural first and second wires 41 and 42 located below the third semiconductor chip 33 from being deformed, and consequently to prevent short-circuit between the wires.

Embodiment 6

In embodiment 6, explanations will be given mainly on differences from embodiment 1, and common points are referred to the description of embodiment 1 on demand.

As shown in FIG. 1B, in the semiconductor device 1 of embodiment 1, the first to third semiconductor chips 31 to 33 having the same shape are used.

Figure 6:
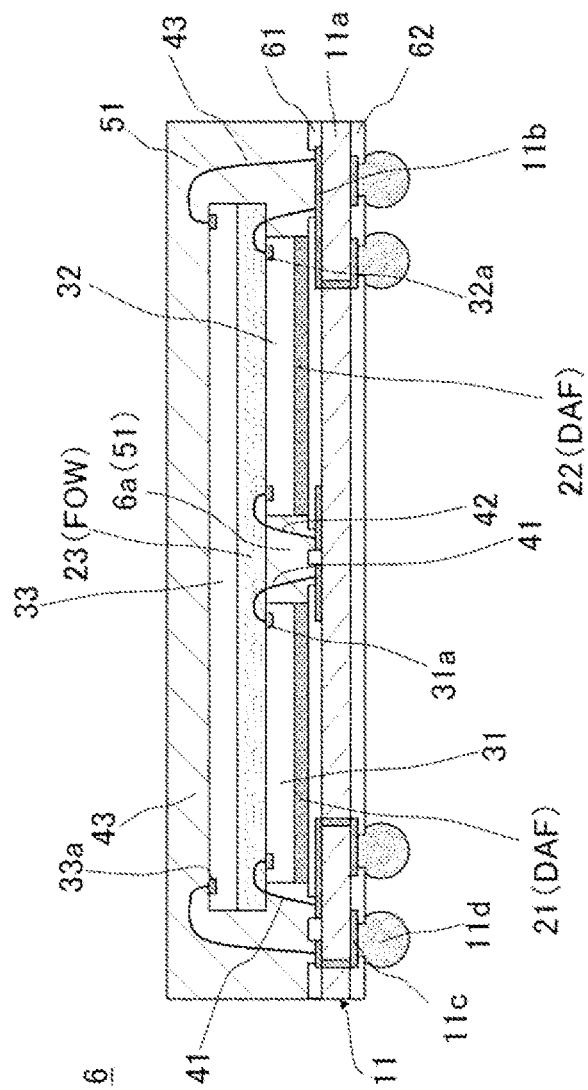
FIG. 6 is a cross-sectional view that schematically shows the outline configuration of a semiconductor device in accordance with embodiment 6.

As shown in FIG. 6, in a semiconductor device 6 in accordance with embodiment 6, the third semiconductor chip 33 having a shape different from that of the first and second semiconductor chips 31 and 32 is used. That is, the third semiconductor chip 33 is made larger than the first and second semiconductor chips 31 and 32, and is designed such that when mounted, it overhangs (protrudes therefrom) from the first and second semiconductor chips. The same is true for the third adhesive layer 23. Into the third adhesive layer 23, at least one portion of the plural first and second wires 41 and 42 in the center area and the peripheral area is embedded.

Additionally, the filling layer 6a (51) is formed by the sealing material 51 in the same manner as in the filling layer 1a of embodiment 1; however, this may be formed by using the third adhesive layer 23 shown in FIG. 4B or another resin layer 71 shown in FIG. 5A or FIG. 5B.

In accordance with the semiconductor device 6 of embodiment 6, the same effects as those of the semiconductor device 1 of embodiment 1 can be obtained, and the following effects are also obtained.

Since at least one portion of the entire portion of the plural first and second wires 41 and 42 is embedded in the third adhesive layer 23, the warpage of the semiconductor device 6 can be further reduced, and the wire flowing can be further reduced.

In the foregoing description, explanations have been given based upon the embodiments, etc. of the invention made by the present inventors; however, the present invention is not intended to be limited by the above-mentioned embodiments, and it is needless to say that various modifications may be made therein within a scope not departing from the gist of the present invention. For example, as the wiring substrate, a rigid wiring substrate such as a glass epoxy substrate or the like and a flexible wiring substrate using a polyimide substrate or the like, or a wiring substrate having an intermediate characteristic between these two may be properly selected and used on demand. As the semiconductor chip, a memory chip, a logic chip and other chips may be properly selected and adopted. The plural semiconductor chips to be mounted may have the same configuration or may have different configurations. For example, a DRAM, a Flash memory, or the like may be mounted.

Conclusion

In one embodiment, there is provided a semiconductor device comprising: a substrate; a first semiconductor chip mounted over the substrate with a first adhesive therebetween; a second semiconductor chip mounted over the substrate with a second adhesive therebetween, the second semiconductor chip being apart from the first semiconductor chip; a third semiconductor chip stacked over the first and second semiconductor chips with a third adhesive having a first portion between the third and first semiconductor chips and a second portion between the third and second semiconductor chips, each of the first and second portions being in thickness than each of the first and second adhesive; and a sealing resin over the substrate to cover the first, second and third semiconductor chips.

In other embodiment, there is provided a semiconductor device comprising: a substrate; first, second and third semiconductor chips provided over the substrate so as to form a space that is defined by the first, second and third semiconductor chips, the first, second and third semiconductor chips being bonded with first, second and third adhesive, the third adhesive being larger in thickness than each of the first and second adhesives; a filling material provided in the space; and a sealing resin over the substrate to cover the first, second and third semiconductor chips, the filling material has a composition different from that of the sealing resin.

In another embodiment, there is provided a semiconductor device comprising: a substrate; a first semiconductor chip mounted over the substrate; a second semiconductor chip mounted over the substrate, the second semiconductor chip being apart from the first semiconductor chip; the third semiconductor chip stacked over the first and second semiconductor chips; a sealing resin over the substrate to cover the first, second and third semiconductor chips; a filling material provided between the first and second semiconductor chips, the filling material having a composition different from that of the sealing resin.

(Supplementary Note)

[Supplementary Note 1; Fourth Aspect]

A method for manufacturing a semiconductor device comprising the steps of:

mounting first and second semiconductor chips on one surface of a wiring substrate with first and second adhesive layers interposed therebetween;

electrically connecting the wiring substrate with the first and second semiconductor chips by using first and second wires;

mounting the third semiconductor chip on the first and second semiconductor chips via a third adhesive layer so as to straddle the first and second semiconductor chips, with at least one portion of a plurality of wires located below the third semiconductor chip of the first and second wires being embedded into the third adhesive layer formed on a rear surface of the third semiconductor chip;

electrically connecting the wiring substrate with the third semiconductor chip by using a third wire; and forming a sealing layer covering the first to third semiconductor chips on the one surface of the wiring substrate by using a sealing material, as well as filling a space surrounded by the first to third semiconductor chips and the one surface of the wiring substrate.

[Supplementary Note 2, Fifth Aspect]

A method for manufacturing a semiconductor device comprising the steps of:

mounting first and second semiconductor chips on one surface of a wiring substrate with first and second adhesive layers interposed therebetween;

electrically connecting the wiring substrate with the first and second semiconductor chips by using first and second wires;

mounting the third semiconductor chip on the first and second semiconductor chips via a third adhesive layer so as to straddle the first and second semiconductor chips, with at least one portion of a plurality of wires located below the third semiconductor chip of the first and second wires being embedded into the third adhesive layer formed on a rear surface of the third semiconductor chip, so as to fill a space surrounded by the first to third semiconductor chips and the one surface of the wiring substrate by the third adhesive layer;

electrically connecting the wiring substrate with the third semiconductor chip by using a third wire; and forming a sealing layer covering the first to third semiconductor chips on the one surface of the wiring substrate.

[Supplementary Note 3, Sixth Aspect]

A method for manufacturing a semiconductor device comprising the steps of:

mounting first and second semiconductor chips on one surface of a wiring substrate with first and second adhesive layers interposed therebetween;

electrically connecting the wiring substrate with the first and second semiconductor chips by using first and second wires;

filling at least one portion of a space surrounded by the first and second semiconductor chips and the one surface of the wiring substrate by using another resin material;

mounting the third semiconductor chip on the first and second semiconductor chips via a third adhesive layer so as to straddle the first and second semiconductor chips, with at least one portion of a plurality of wires located below the third semiconductor chip of the first and second wires being embedded into the third adhesive layer formed on a rear surface of the third semiconductor chip;

electrically connecting the wiring substrate with the third semiconductor chip by using a third wire; and forming a sealing layer covering the first to third semiconductor chips on the one surface of the wiring substrate.

The following description exemplifies preferred configurations of the first to sixth aspects.

[Supplementary Note 4]

First and second wires that electrically connect the wiring substrate with the first and second semiconductor chips are provided, and the third adhesive layer is formed so as to embed at least one portion of a plurality of wires at least located below the third semiconductor chip of the first and second wires.

[Supplementary Note 5]

The third adhesive layer is formed so as to fill a space between the first and second semiconductor chips.

[Supplementary Note 6]

A filling layer that fills a space surrounded by the first to third semiconductor chips and the one surface of the wiring substrate is provided, and the filling layer is formed by at least one material selected from the group consisting of a sealing resin for sealing the first to third semiconductor chips, an adhesive material forming the third adhesive layer and another resin material.

[Supplementary Note 7]

The third semiconductor chip is mounted in a manner so as to intersect with the first and second semiconductor chips such that the aligning direction of electrode pads of the first and second semiconductor chips and the aligning direction of electrode pads of the third semiconductor chip are made different from each other.

[Supplementary Note 8]

A filling layer, which is formed in the space by using another resin material and fills one portion or the entire portion of a plurality of wires below the third semiconductor chip of plural first and second wires that electrically connect the wiring substrate with the first and second semiconductor chips, is provided. This filling layer is formed between one surface or a first insulating film of a third wiring substrate and a third adhesive layer.

[Supplementary Note 9]

A semiconductor chip that further overhangs in comparison with the first and second semiconductor chips is used as the third semiconductor chip, and the third adhesive layer is also formed so as to further overhang in comparison with the first and second semiconductor chips so that at least one portion of all the first and second wires that electrically connect the wiring substrate with the first and second semiconductor chips is embedded into the third adhesive layer.

[Supplementary Note 10]

The third adhesive layer is formed by using an adhesive material having a viscosity lower than that of the first and second adhesive layers.

Additionally, within a scope of the entire disclosure (including claims and drawings) of the present invention, as well as based upon its basic technical ideas, modifications and adjustments of embodiments or examples can be made. Moreover, various combinations and selections may be made among various disclosure elements (including the respective elements of the respective claims, the respective elements of the respective embodiments or examples, and the respective elements, etc. of the respective drawings) within the scope of the claims of the present invention. That is, it is needless to say that various modifications and revisions that can be made by those who are skilled in the art in accordance with the entire disclosure including claims and drawings and technical ideas will fall within the scope of the present invention. Furthermore, with respect to numeric values and numeric value ranges described in the present application, it is regarded that desired intermediate values, lower numeric values and smaller ranges are included within the scope of the present invention even when those values are not specifically described.

What is claimed is:

1. A semiconductor device comprising:
   a substrate;
   a first semiconductor chip mounted over the substrate with a first adhesive therebetween;
   a second semiconductor chip mounted over the substrate with a second adhesive therebetween, the second semiconductor chip being apart from the first semiconductor chip;
   a third semiconductor chip stacked over the first and second semiconductor chips with a third adhesive having a first portion between the third and first semiconductor chips and a second portion between the third and second semiconductor chips, each of the first and second portions being larger in thickness than each of the first and second adhesives;
   a sealing resin over the substrate to cover the first, second and third semiconductor chips;
   a plurality of first wires coupling the first semiconductor chip to the substrate;
   a plurality of second wires coupling the second semiconductor chip to the substrate; and
   a plurality of third wires coupling the third semiconductor chip to the substrate.

2. The semiconductor device as claimed in claim 1, further comprising:
   a filling material provided between the first and second semiconductor chip, the filling material having a composition different from that of the sealing resin.

3. The semiconductor device as claimed in claim 2, wherein a space defined by the first, second and third semiconductor chips is filled with the filling material.

4. The semiconductor device as claimed in claim 1, wherein a thickness of each of the first and second adhesives is defined by a distance between a top surface of the substrate and a bottom surface of a corresponding one of the first and second semiconductor chip, and
   a thickness of the third adhesive is defined by a distance between a bottom surface of the third semiconductor chip and a top surface of the first semiconductor chip or the second semiconductor chip.

5. The semiconductor device as claimed in claim 2, wherein the first and second wires are completely covered with the filling material.

6. The semiconductor device as claimed in claim 2, wherein the filling material is a part of the third adhesive.

7. The semiconductor device as claimed in claim 2, wherein the filling material is an underfill material.

8. The semiconductor device as claimed in claim 1, wherein each of the first and second semiconductor chips has a rectangular shape in a plan view, and
   the second semiconductor chip is mounted over the substrate so that a long side of the second semiconductor chip is in parallel to a long side of the first semiconductor chip.

9. The semiconductor device as claimed in claim 8, wherein the third semiconductor chip has a rectangular shape in the plan view, and
   the third semiconductor chip is stacked over the first and second semiconductor chips so that a long side of the third semiconductor chip is in perpendicular to the long side of the first semiconductor chip.

10. The semiconductor device as claimed in claim 8, wherein the third semiconductor chip is larger in size than a sum of the first and second semiconductor chips.

11. The semiconductor device as claimed in claim 2, wherein:
    each of the first wires includes a first end that is coupled to the first semiconductor chip and a second end that is coupled to the substrate, the first ends of the first wires being covered with the third adhesive, and the second ends of the first wires being covered with the filling material; and
    each of the second wires includes a third end that is coupled to the second semiconductor chip and a fourth end that is coupled to the substrate, the third ends of the second wires being covered with the third adhesive, and the fourth ends of the second wires being covered with the filling material.

12. A semiconductor device comprising:
    a substrate;
    first, second and third semiconductor chips provided over the substrate so as to form a space that is defined by the first, second and third semiconductor chips, the first, second and third semiconductor chips being bonded with first, second and third adhesives, the third adhesive being larger in thickness than each of the first and second adhesives;
    a filling material provided in the space;
    a sealing resin over the substrate to cover the first, second and third semiconductor chips, the filling material has a composition different from that of the sealing resin;
    a plurality of first wires coupling the first semiconductor chip to the substrate, the first wires being covered with the filling material;
    a plurality of second wires coupling the second semiconductor chip to the substrate, the second wires being covered with the filling material; and
    a plurality of third wires coupling the third semiconductor chip to the substrate, the third wires being covered with the sealing resin.

13. A semiconductor device comprising:

a substrate;

a first semiconductor chip mounted over the substrate;

a second semiconductor chip mounted over the substrate, the second semiconductor chip being apart from the first semiconductor chip;

a third semiconductor chip stacked over the first and second semiconductor chips;

a sealing resin over the substrate to cover the first, second and third semiconductor chips;

a filling material provided between the first and second semiconductor chips, the filling material having a composition different from that of the sealing resin;

a plurality of first wires coupling the first semiconductor chip to the substrate, the first wires being covered with the filling material;

a plurality of second wires coupling the second semiconductor chip to the substrate, the second wires being covered with the filling material; and a plurality of third wires coupling the third semiconductor chip to the substrate, the third wires being covered with the sealing resin.

14. The semiconductor device as claimed in claim 13, further comprising:

a first adhesive intervening between the first semiconductor chip and the substrate;

a second adhesive intervening between the second semiconductor chip and the substrate; and a third adhesive intervening between the third semiconductor chip and each of the first and second semiconductor chips.

15. The semiconductor device as claimed in claim 13, wherein the third semiconductor chip is stacked over the first and second semiconductor chips via a third adhesive, each of the first wires includes a first end coupled to the first semiconductor chip and a second end coupled to the substrate, the first ends of the first wires are covered with the third adhesive, the second ends of the first wires are covered with the filling material, and each of the second wires includes a third end coupled to the second semiconductor chip and a fourth end coupled to the substrate, the third ends of the second wires are covered with the third adhesive, the fourth ends of the second wires are covered with the filling material.

16. The semiconductor device as claimed in claim 14, wherein the third adhesive is larger in thickness than each of the first and second adhesives.

17. The semiconductor device as claimed in claim 13, wherein each of the first, second and third semiconductor chip is a rectangular shape in a plan view, the second semiconductor chip is mounted over the substrate so that a long side of the second semiconductor chip is in parallel to a long side of the first semiconductor chip, and the third semiconductor chip is stacked over the first and second semiconductor chips so that a long side of the third semiconductor chip is in perpendicular to the long side of the first semiconductor chip.

18. The semiconductor device of claim 12, wherein:

the first semiconductor chip comprises a first electrical circuit;

the second semiconductor chip comprises a second electrical circuit; and the third semiconductor chip comprises a third electrical circuit.

19. The semiconductor device of claim 12 wherein:

the first semiconductor chip comprises a first memory circuit;

the second semiconductor chip comprises a second memory circuit; and the third semiconductor chip comprises a third memory circuit.

* * * * *